(12) United States Patent
Johnson (10) Patent No.: US 6,617,913 B1
(45) Date of Patent: Sep. 9, 2003

(54) SELF-LATCHING H-BRIDGE SYSTEM AND APPARATUS

(75) Inventor: Duane Carl Johnson, White Bear Lake, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/940,417

(22) Filed: Aug. 27, 2001

(51) Int. Cl.[7] ............................................... H03K 17/56
(52) U.S. Cl. ..................... 327/423; 327/110; 327/587
(58) Field of Search ................................. 327/110, 423, 327/428, 438–440, 442, 468, 587

(56) References Cited

U.S. PATENT DOCUMENTS

| | | |
|---|---|---|
| 3,842,335 A | 10/1974 | Boksjo |
| 4,020,411 A | 4/1977 | Tsuboi et al. |
| 4,245,293 A | 1/1981 | Terunuma et al. |
| 4,361,866 A | 11/1982 | Shima et al. |
| 4,415,963 A | 11/1983 | Rippel et al. |
| 4,423,477 A | 12/1983 | Gurr |
| 4,446,513 A * | 5/1984 | Clenet ........................ 363/132 |
| 4,460,950 A | 7/1984 | Finney |
| 4,567,420 A | 1/1986 | Beck |
| 4,635,181 A | 1/1987 | Bourgeault |
| 5,257,175 A * | 10/1993 | Skelton et al. ................. 363/56 |
| 5,469,096 A * | 11/1995 | Nessi et al. .................. 327/112 |
| 5,824,017 A | 10/1998 | Sullivan et al. |
| 5,898,585 A | 4/1999 | Sirichote et al. |
| 5,952,856 A * | 9/1999 | Horiguchi et al. .......... 327/110 |
| 5,963,440 A | 10/1999 | Gibbs et al. |
| 5,963,441 A | 10/1999 | Gibbs et al. |
| 6,041,254 A | 3/2000 | Sullivan et al. |
| 6,046,917 A | 4/2000 | Gibbs et al. |
| 6,104,953 A | 8/2000 | Leyde |
| 6,175,765 B1 | 1/2001 | Sullivan et al. |
| 6,215,271 B1 | 4/2001 | Lerow et al. |

* cited by examiner

*Primary Examiner*—Kenneth B. Wells
(74) *Attorney, Agent, or Firm*—Charles A. Johnson; Mark T. Starr; Crawford, Maunu PLLC (57) ABSTRACT

A system and apparatus for controlling a motor or other multi-directional load using an H-bridge circuit having self-latching, high side switches. Thyristors are used as high side switches, and arranged to self-latch. The H-bridge thyristors are also arranged to automatically discontinue the triggering gate current upon the thyristor switch closing to conduct current, which advantageously terminates the flow of gate current as soon as it is no longer required.

35 Claims, 5 Drawing Sheets

SELF-LATCHING H-BRIDGE SYSTEM AND APPARATUS

FIELD OF THE INVENTION

This invention relates generally to motor control circuits, and more particularly to a system and apparatus for controlling a motor or other load using an H-bridge circuit having self-latching, high side switches.

BACKGROUND OF THE INVENTION

Bi-directional motors are useful for controlling a wide variety of devices requiring motion. For example, robotic movements are generally controlled using a number of reversible motors to control the movement of the various components. Other examples include movement of satellite disks, solar concentrator arrays that track the sun, and the like. The very nature of a stepper motor requires that it be moved in both the forward and reverse directions.

Directing current through a motor will cause the motor to turn in one direction, but as described above, it is often desirable to turn the motor in the opposite direction. To control a bi-directional motor and resultantly achieve bi-directional movement, an "H-bridge," also referred to as a push-pull motor driver, is often used. The term "H-bridge" comes from the circuit configuration itself, as its schematic resembles the letter "H."

Conventional H-bridge configurations have utilized power MOSFET devices for each switch of the H-bridge. One reason is that MOSFET devices can be sized to handle the current demands of the motors being driven, and MOSFET devices are voltage-controlled and draw virtually no gate current. These MOSFET devices must be continuously supplied with a voltage to maintain a state of the transistor switch. Other H-bridge configurations have included all-bipolar designs, such as using bipolar junction transistors (BJT). Such bipolar devices, however, require supplying continuous base currents to continuously close the transistor switch. Further, such bipolar devices generally exhibit large voltage drops across the bipolar output transistors, thereby dissipating a proportionally large amount of heat. This may necessitate the use of heat sinks or other means of cooling the involved circuitry.

Prior art H-bridge circuits often require level shifters and drivers to drive the high side of the H-bridge. This results in greater circuit complexity, while driving up costs and required circuit board real estate. Another significant disadvantage associated with the use of such drivers is the need to power the driver. Either auxiliary power supplies must be used, or some manner of sharing and converting the motor power supply voltage must be implemented. This further adds to the complexity, cost, and circuit area demands.

Therefore, it would be desirable to provide a system and apparatus that does not require continuous control signals to drive high side H-bridge switches and avoids the need for external drivers and associated power supplies, while reducing cost, complexity, and real estate limitations. The present invention provides a solution to these and other problems of the prior art, and offers other advantages over prior art H-bridge configurations.

SUMMARY OF THE INVENTION

The present invention relates to an H-bridge system and apparatus for controlling a motor or other multi-directional load using an H-bridge circuit having self-latching, high side switches.

In accordance with one embodiment of the invention, an H-bridge is provided for controlling current through a load, where the H-bridge is coupled between a supply voltage and a reference voltage. The H-bridge includes a forward circuit that is coupled between the supply and reference voltages. The forward circuit includes a low side switch, a high side thyristor, and the load. A forward input signal is received at both the switch and at a control gate of the thyristor. Asserting the forward input signal turns on the low side switch and the high side thyristor, which allows current to flow through the high side thyristor, the low side switch, and the load. A reverse circuit is also provided, which is coupled between the supply and reference voltages. The reverse circuit includes a second low side switch, a second high side thyristor, and the load. A reverse input signal is received at both the second low side switch and at the control gate of the second high side thyristor. Asserting the reverse input signal turns on the second low side switch and the second high side thyristor, which allows current to flow through the second high side thyristor, the second low side switch, and the load.

In accordance with more specific embodiments of the H-bridge according to the invention, an isolation protection circuit may be provided. This isolation circuit is coupled to the gates of the thyristors to isolate the low end switches from a voltage imparted to the control gates of the thyristors, when that particular thyristor has been turned on. In one embodiment, the isolation protection circuit includes a pair of diodes, each one coupled to the control gate of the thyristors. Other specific embodiments include a snubber circuit coupled between the supply voltage and the load to minimize voltage transients caused by back-electromotive force (EMF) or inductive kick back, which occurs upon switching the current direction through the load. One embodiment of a snubber circuit includes a pair of diodes, one for each of the forward and reverse circuits, coupled between the power supply and different load leads.

In accordance with another embodiment of the invention, a polyphase H-bridge is provided for controlling currents through n different loads, where n is greater than one. The polyphase H-bridge is coupled between a supply voltage and a reference voltage, and includes n high side thyristors each having a cathode, an anode, and a control gate. Each of the n loads is coupled between the cathodes of two different thyristors. Also provided is n low side switches, each coupled between one of the thyristors and the reference voltage, where each of the n low side switches includes a control input. Further, n H-bridge input terminals are provided, each coupled to the control gates of the thyristors and the control input of the low side switches across the loads in which current is to flow. Asserting a signal at a corresponding one of the n H-bridge input terminals enables the current to flow through the respective loads.

In accordance with another embodiment of the invention, a system for controlling a motor is provided. The system includes a motor direction control circuit to output forward and reverse direction signals. A hold-off circuit delays assertion of either the forward or reverse direction signals until the other direction signal has been disabled. A DC motor capable of operation in both forward and reverse directions is provided, as is an H-bridge coupled to the DC motor. The H-bridge receives the forward and reverse direction signals from the hold-off circuit, and is coupled between a supply voltage and a reference voltage. The H-bridge includes a forward circuit that is coupled between the supply and reference voltages. The forward circuit includes a low side switch, a high side thyristor, and the load. A forward input signal is received at both the switch and at a control gate of the thyristor. Asserting the forward input signal turns on the low side switch and the high side thyristor, which allows current to flow through the high side thyristor, the low side switch, and the load. A reverse circuit is also provided, which is coupled between the supply and reference voltages. The reverse circuit includes a second low side switch, a second high side thyristor, and the load. A reverse input signal is received at both the second low side switch and at the control gate of the second high side thyristor. Asserting the reverse input signal turns on the second low side switch and the second high side thyristor, which allows current to flow through the second high side thyristor, the second low side switch, and the load.

In accordance with another embodiment of the invention, a self-latching H-bridge circuit for controlling current through a load is provided, where the H-bridge is powered by a power source. The H-bridge includes a first silicon-controlled rectifier (SCR) having an anode, a cathode, and a gate input; where the first SCR is coupled to the power source via the anode. A first switch is coupled between a reference voltage and the cathode of the first SCR through the load, where the first switch includes a first control input. A first buffer is coupled to the first SCR gate input, and the first control input, to turn on the first SCR and the first switch upon output of a forward direction signal. A second SCR includes an anode, a cathode, and a gate input; where the second SCR is coupled to the power source via the anode. A second switch is coupled between the reference voltage and the cathode of the second SCR through the load, where the second switch includes a second control input. The H-bridge also includes a second buffer coupled to the second SCR gate input, and to the second control input, to turn on the second SCR and the second switch upon output of a reverse direction signal.

Still other objects and advantages of the present invention will become readily apparent to those skilled in this art from the following detailed description. As will be realized, the invention is capable of other and different embodiments, and its details are capable of modification without departing from the scope and spirit of the invention. Accordingly, the drawing and description are to be regarded as illustrative in nature, and not as restrictive.

BRIEF DESCRIPTION OF THE DRAWINGS

The invention is described in connection with the embodiments illustrated in the following diagrams.

DETAILED DESCRIPTION OF THE ILLUSTRATED EMBODIMENTS

In the following description of the various embodiments, reference is made to the accompanying drawings, which form a part hereof, and in which is shown by way of illustration various embodiments in which the invention may be practiced. It is to be understood that other embodiments may be utilized, and structural and functional modifications may be made without departing from the scope of the present invention.

Generally, the present invention is directed to a system and apparatus for controlling a motor or other multi-directional load using an H-bridge circuit having self-latching, high side switches. Thyristors are used as high side switches, and arranged to self-latch. The H-bridge thyristors are also arranged to automatically discontinue the triggering gate current upon the thyristor switch closing to conduct current, which advantageously terminates the flow of gate current as soon as it is no longer required.

Figure 1:
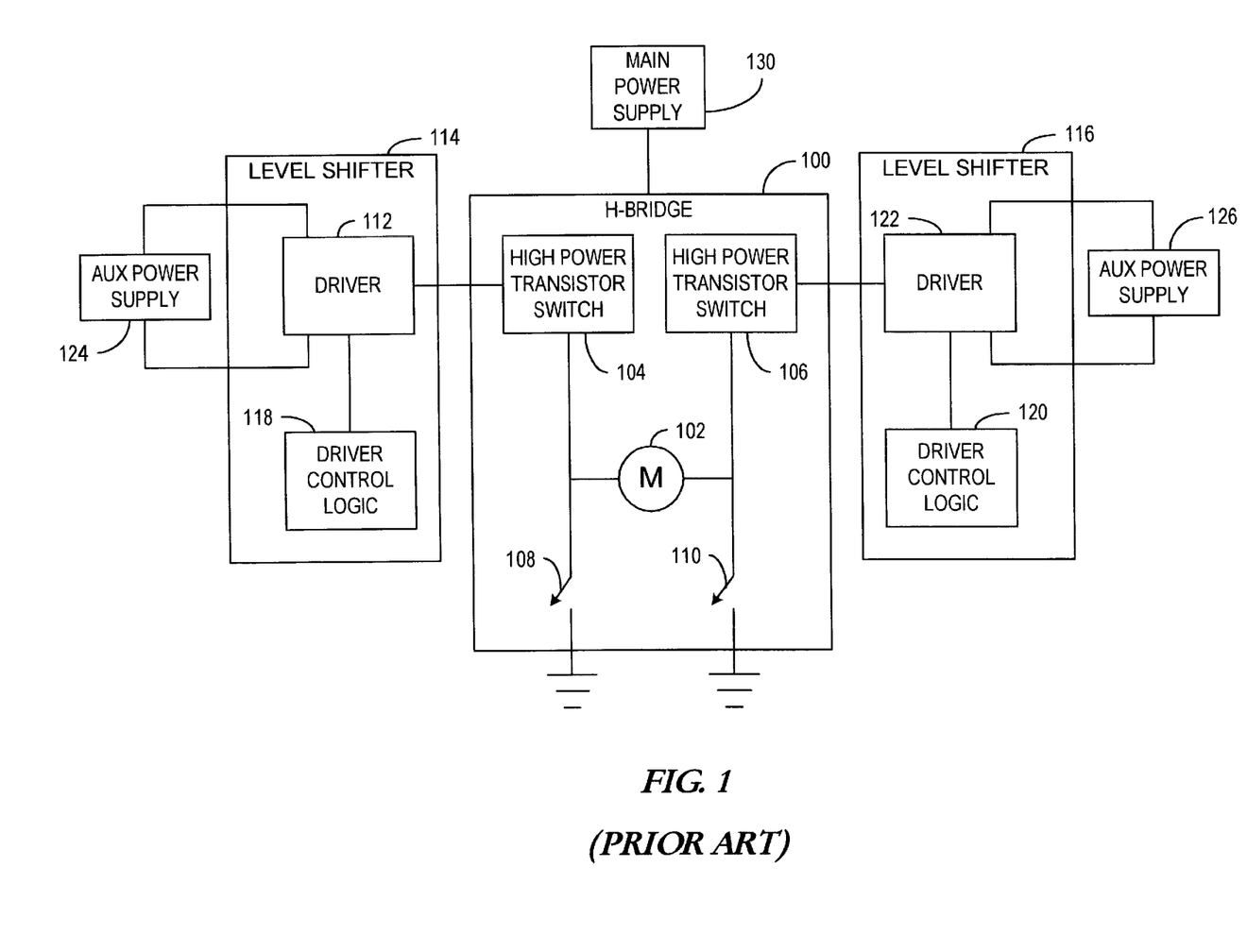
FIG. 1 illustrates a prior art motor control configuration implementing an H-bridge.

FIG. 1 illustrates a prior art motor control configuration implementing an H-bridge 100. The H-bridge 100 is used to control and provide power to the motor 102. High-power transistor switches 104, 106 are used on the H-bridge high side, and additional switches 108, 110 are used on the low side of the H-bridge. A conventional H-bridge often utilizes MOSFETs for all of the switches 104, 106, 108, 110 in the circuit. When the high power transistor switch 104 and the low side switch 110 are on, the motor 102 is operated in a forward direction. When the high power transistor switch 106 and the low side switch 108 are on, the motor 102 is operated in a reverse direction.

In the prior art, circuitry is required to drive the high power switches 104, 106 on the high side of the H-bridge 100. As can be seen from FIG. 1, a driver 112 is associated with a level translation circuit, such as level shifter 114, to drive the high power switch 104. The level shifters 114, 116 generally translate the driver control logic signals from the logic level used in the driver control logic circuits 118, 120 to the voltage levels required by the high power switches 104, 106. The driver 122 associated with level shifter 116 is used to drive the high power switch 106. The drivers 112, 122 are controlled by driver control circuits 118, 120 respectively. As can be seen, rather than simply sending a trigger signal to activate the high power switches 104, 106, driver control circuits and associated drivers are traditionally used to activate the appropriate high power switches 104, 106. This results in greater circuit board area requirements, as well as increased design complexity and cost.

The use of the driver circuits 112, 122 of the respective level shifters 114, 116 also requires that the driver circuits 112, 122 continually provide a voltage or current to the gates/bases of their respective high power transistor switches 104, 106. This requires generation of the appropriate bias current or voltage to maintain the respective high power transistor switches in the desired switch state. For example, where bipolar transistors are used as the high side transistor switches 104, 106, a continuous base drive current must be supplied. Similarly, if bipolar transistors are used on the low side, a continual current must again be provided to maintain a low side switch in an "ON" state.

Furthermore, the drivers 112, 122 must be powered. These drivers 112, 122 are powered by auxiliary DC power supplies 124, 126 respectively. A power supply 130 is also required for driving the motor 102, which is often a different voltage than that required to power the drivers 112, 122 associated with the level shifters 114, 116. This further adds to the required circuit area, cost, and complexity. For example, the driver 112 may operate from a 5 V DC power supply 124, while the motor 102 may require a high voltage to obtain the requisite current for proper operation. This requires an even greater amount of circuitry, including one or more auxiliary power supplies 124, 126, DC-DC voltage converters, or other circuitry to accommodate the disparate voltage and current requirements of the level shifter circuits 114,116 and the motor 102.

Figure 2:
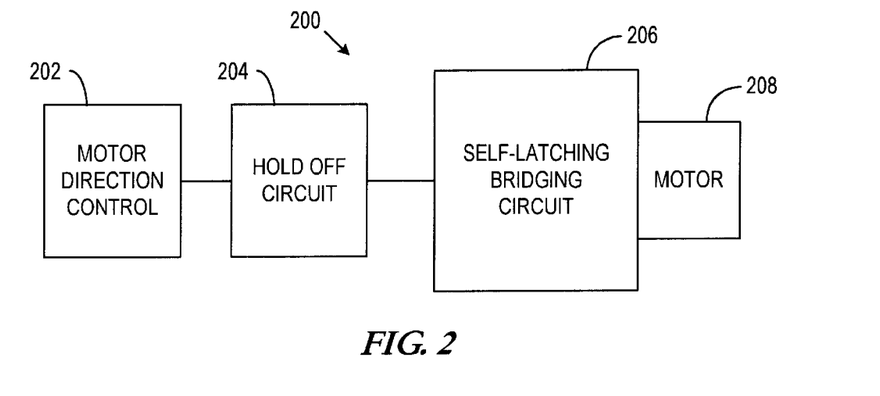
FIG. 2 is a block diagram of a motor control circuit in accordance with the principles of the present invention.

FIG. 2 is a block diagram of a motor control circuit 200 in accordance with the present invention. A motor direction control circuit 202 determines the direction in which the motor 208 will turn. In one embodiment, the motor direction control circuit 202 includes a pair of switches, where one switch is associated with each turning direction of the motor 208. When a switch is closed, a corresponding portion of the motor control circuit 200 is activated which ultimately results in turning on the appropriate H-bridge high and low side switches to cause the motor to turn in a first direction. When the other switch of the motor direction control circuit 202 is closed, another corresponding portion of the motor control circuit 200 is activated which ultimately results in turning on the appropriate H-bridge high and low side switches to cause the motor to turn in the opposite direction.

The motor direction control circuit 202 further includes a hold-off circuit 204 in one embodiment of the invention. The hold-off circuit 204 ensures that there is a hold-off time after turning off one side of the H-bridge, as initiated by the motor direction control circuit 202, before the other side of the H-bridge bridge is turned on. This essentially ensures that both switches on a common leg of the H-bridge are not turned on at the same time, essentially short-circuiting the motor power supply to ground, and damaging the H-bridge components. In one embodiment, the hold-off circuit 204 implements a delay circuit, such as a resistor-capacitor delay circuit, to provide the appropriate delays to ensure the appropriate hold-off time.

The hold-off circuit 204 is coupled to the self-latching bridging circuit 206, which in turn controls operation of the motor 208. The self-latching bridging circuit 206 includes an H-bridge in one embodiment of the invention, and is designed such that there is no need for a high side driver as conventional motor control circuits use. This makes the circuit less complex, and requires fewer components, thereby reducing cost and improving circuit reliability.

Figure 3:
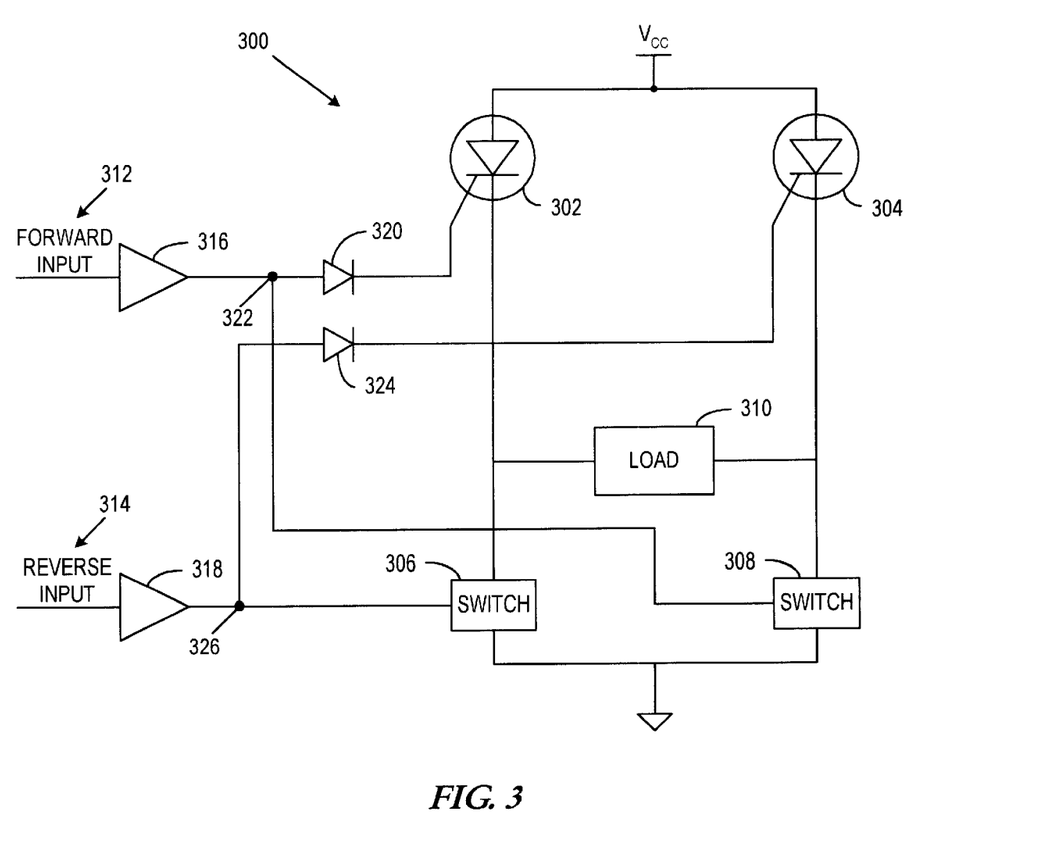
FIG. 3 illustrates a self-latching H-bridge in accordance with the invention.

FIG. 3 illustrates a self-latching H-bridge 300 in accordance with the invention. The exemplary H-bridge 300 in accordance with the present invention is self-latching, thereby avoiding the need to provide a continuous drive current or voltage to the high-side switching elements. The exemplary H-bridge 300 also eliminates the need to provide driver circuits that require auxiliary power supplies.

The H-bridge 300 includes a pair of thyristors 302, 304 serving as the high-side, high power switches. A thyristor is also known as a silicon-controlled rectifier (SCR), and is the solid state equivalent of a thyristor. Other analogous components having the characteristics of a thyristor could alternatively be used, such as a triac which is similar to a thyristor, but allows current to flow in both directions. The SCRs may be n-type SCRS, p-type SCRS, or any other analogous technology. Another form of SCR can be constructed from cross-coupled NPN and PNP BJTs. The particular triggering voltages applied are dependent upon the actual type of SCR implemented, but those skilled in the art will readily appreciate the particular type of SCR to utilize from an understanding of the description provided herein.

A thyristor (referred to hereinafter as an SCR) is a component similar to a diode, but will not conduct until a voltage is applied to its third terminal referred to as the gate. Current flows from the anode of the SCR to the cathode when a suitable trigger signal is applied to the SCR gate. Once conducting, the SCR will continue to conduct, even though the trigger signal is no longer present at the gate. Current will conduct until the current through the SCR is decreased below a current threshold generally referred to as the holding current ($I_h$), at which time the SCR is reset, and will no longer conduct until another trigger signal is applied to the gate.

At the low-side of the H-bridge 300 are two switches 306, 308. Any type of switch may be used for the low-side switches 306, 308. For example, the switches 306, 308 may be MOSFET transistors, bipolar transistors, insulated gate bipolar transistors (IGBT), relays, etc., being specified such that they can adequately handle the current flow through the bridge. Different types of a particular technology may also be implemented. For example, in the case of a MOSFET, n-type MOSFETs or p-type MOSFETS may be used, and may be used in an enhancement or depletion mode. The particular type used depends on the particular implementation, as those skilled in the art will readily appreciate from the description provided herein. For example, when changing from n-type to p-type devices, those skilled in the art will understand that power supply polarities will be changed, as will the orientation of the isolation and snubber diodes described more fully below.

The load 310 represents the device through which the current is being passed. The load can be any load in which current is to be passed through in more than one direction, such as a motor, stepper motor, or even a resistor or other passive load. In one embodiment of the invention, the load 310 is a motor controlled by the H-bridge 300. Generally, when the SCR 302 and switch 308 are turned on, current passes from VCC, through SCR 302, through the load 310, through switch 308, and to ground. Alternatively, when the SCR 304 and switch 306 are turned on, current passes from VCC, through SCR 304, through the load 310, through switch 306, and to ground. In this manner, current is directionally passed through the load 310, depending on which SCRs and switches are on.

The inputs to the H-bridge 300 are the forward input signal 312 and the reverse input signal 314. In an embodiment such as the exemplary embodiment shown in FIG. 2, the forward/reverse input signals 312, 314 are provided by the motor direction control circuit 202 and hold-off circuit 204. The signals 312, 314 identify which direction current is to be directed through the motor or other load 310. In the embodiment illustrated in FIG. 3, each input signal 312, 314 is coupled to the H-bridge 300 through buffers 316, 318 respectively. These buffers 316, 318 drive the appropriate SCRs 302, 304 and low side switches 306, 308.

When the forward input signal 312 is asserted, a trigger signal is generated at the output of buffer 316. This trigger signal is passed through diode 320 from anode to cathode, and the diode 320 is arranged such that its cathode is coupled to the gate of the SCR 302 where the current flows through the gate-to-cathode junction. The trigger signal at node 322 is also routed to switch 308 to turn it on, in order to complete the forward-direction circuit through the load 310 to ground. Similarly, when the reverse input signal 314 is asserted, a trigger signal is generated at the output of buffer 318 which is passed through diode 324 from anode to cathode. The diode 324 is arranged such that its cathode is coupled to the gate of the SCR 304 where the current flows through the gate-to-cathode junction. The trigger signal at node 326 is also provided to turn on switch 306 in order to complete the reverse-direction circuit through the load 310 to ground.

In operation, an asserted forward input signal 312 generates a trigger signal at node 322, which is passed through diode 320 to the gate of the SCR 302. This signal at node 322 concurrently turns on SCR 302 and switch 308, allowing current to pass through the load 310 in the forward direction. After the SCR 302 has been turned on, the voltage at the cathode of the SCR 302 rises towards VCC, and eventually reaches a voltage that causes the cathode-to-gate voltage of the SCR 302 to become reverse biased. This automatically terminates the flow of gate current to the SCR 302—effectively resulting in a pulsed gate current at the SCR 302. The SCR 302 continues to conduct current following the gate current pulse. When the trigger signal at node 322 is removed, switch 308 will be turned off, essentially opening the circuit through the load 310. This causes the SCR 302 to turn off when the current through the SCR 302 decreases below the holding current $I_h$. Current flow through the SCR 302 is terminated by toggling the signal at the control input of switch 308 such that the current path is opened. The SCR 302 is therefore reset until another trigger signal is applied at the node 322.

The circuit operates analogously in the reverse direction when an asserted reverse input signal 314 generates a trigger signal at node 326. This signal is passed through diode 324 to the gate of the SCR 304, and to a control input of the switch 306, thereby turning on both the SCR 304 and the switch 306 and allowing current to pass through the load 310 in the reverse direction. After the SCR 304 has been turned on, the voltage at the cathode of the SCR 304 rises towards VCC, and eventually reaches a voltage that causes the cathode-to-gate voltage of the SCR 304 to become reverse biased. This automatically terminates the flow of gate current to the SCR 304, but the SCR 304 continues to conduct current. When the trigger signal at node 326 is removed, switch 306 will be turned off, essentially opening the circuit through the load 310. This causes the SCR 304 to turn off when the current through the SCR 304 decreases below the holding current $I_h$. The SCR 304 is therefore reset until another trigger signal is applied at the node 326.

In accordance with one embodiment of the invention, isolation protection is provided to account for a situation where the voltage at the SCR 302, 304 gate is higher than the respective SCR's reverse breakdown voltage for the gate-to-cathode junction. In other words, because the voltage at the cathode of an SCR 302, 304 will rise towards VCC when it is turned on, the gate of the SCR should be protected from being driven to an unacceptable voltage after the SCR is turned on. In a particular example, assume that the motor or other load 310 operates at a current that requires a relatively large VCC voltage as compared to voltages that are typically used to control circuit components such as the SCRs 302, 304, and the low side switches 306, 308. For example, VCC may be 36 volts. When an SCR 302, 304 is turned on, the gate of the particular SCR will thus approach 36 volts, which may exceed the specified maximum reverse breakdown voltage for the gate-to-cathode junction of that SCR and damage the component. Additionally, where the VCC is a relatively large voltage with respect to the voltages used to control the low side switches, this high gate voltage when the SCR is turned on could damage these switches.

Further, the buffers 316, 318 used to provide the trigger signal to the SCRs 302, 304 may advantageously be low voltage buffers, rather than the level shifters and high power drivers used in the prior art, where isolation protection in accordance with the present invention is employed. For example, if the gate voltage of SCR 302 approaches a voltage such as 36 volts once the SCR 302 is turned on, such a voltage could otherwise damage a low voltage buffer 316. Therefore, isolation protection in accordance with the present invention can also allow for the use of low voltage buffers 316, 318 operating at conventional digital component voltages (e.g., 3.3 V, 5 V, etc.), rather than the high power level shifters and drivers used in prior art H-bridges.

In accordance with one embodiment of the invention, this isolation protection is provided by diodes 320 and 324. Considering SCR 302 for example, when SCR 302 is turned on, the voltage at its cathode will approach VCC. Where this voltage could exceed the specified maximum reverse breakdown voltage of the SCR 302, or where the VCC voltage is sufficiently high that it could exceed maximum voltage specifications for other components that would otherwise be coupled to node 322 (e.g., switch 308 or buffer 316), the diode 320 will provide the requisite isolation protection. This is accomplished by arranging the diode 320 such that its cathode is coupled to the SCR 302 gate input, and its anode is coupled to node 322. Diode 324 operates analogously as isolation protection for the circuits components involved when the motor 310 is to be operated in the reverse direction.

The voltage that may be present at an SCR gate, such as the SCR 302 gate, may be less than the specified maximum reverse breakdown voltage of the SCR 302. Further, the VCC voltage may also be a voltage that is within specified limits for other components such as the switch 308 and the buffer 316. In this situation, the reverse breakdown voltage of the SCR 302 is sufficient to adequately provide the isolation protection to the SCR 302, and the diodes 320, 324 need not be used.

Figure 4:
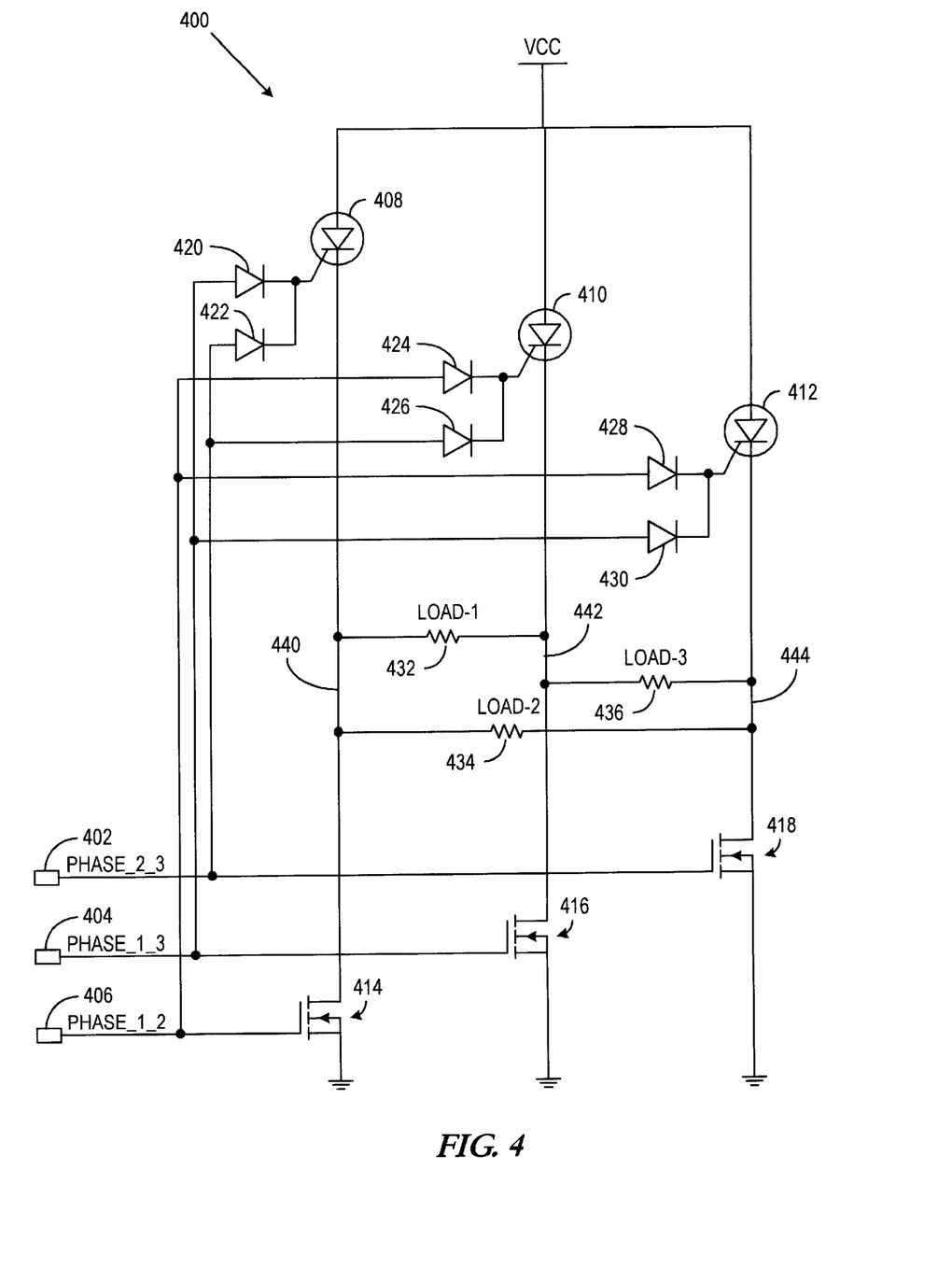
FIG. 4 illustrates an exemplary embodiment of a self-latching H-bridge that accommodates multiple loads.

The H-bridge in accordance with the invention may also be implemented in a polyphase mode, such that it provides current to multiple loads or multiple phases of a load. FIG. 4 illustrates an exemplary embodiment of a self-latching H-bridge 400 that accommodates multiple loads. A motor selector (not shown), analogous to the motor direction control circuit 202 of FIG. 2, may include a number of switches to identify the particular load and direction in which current is to flow through the load. A hold-off circuit such as the hold-off circuit of FIG. 2 may also be used, which provides signals to the H-bridge 400. These signals are shown as Phase_2_3 at input 402, Phase_1_3 at input 404, and Phase_1_2 at input 406.

In a manner analogous to that described in connection with FIG. 3, these signals are provided to SCRs 408, 410, 412 on the high side of the H-bridge, and to switches (e.g., n-type MOSFETS) 414, 416, 418 on the low side of the H-bridge. A pair of isolation protection diodes are coupled to the gate of each SCR. The cathodes of diodes 420, 422 are coupled to the gate of SCR 408. The cathodes of diodes 424, 426 are coupled to the gate of SCR 410, and the cathodes of diodes 428, 430 are coupled to the gate of SCR 412. As described in connection with FIG. 3, each of the SCRs 408, 410, 412 is coupled to a respective one of the n-type MOSFETs 414, 416, 418. As described above, different types of SCRs and MOSFETs can be implemented, such as p-type SCRs, p-type MOSFETS, etc.

In the illustrated embodiment, three loads are shown. Fewer or additional loads can alternatively be used. In this example, the three loads may represent three different motors, or the multiple windings of a three-phase motor. The first load-1 432 is coupled between nodes 440 and 442. The second load-2 434 is coupled between nodes 440 and 444, and the third load-3 436 is coupled between nodes 442 and 444.

When the Phase_2_3 input signal at input 402 is asserted, SCRs 408 and 410 will turn on, as will low side switch 418. This allows current to flow through load-2 434 (e.g., a second motor or a second winding of a three-phase motor), and through load-3 436 (e.g., a third motor or a third winding of a three-phase motor). In this manner, load-2 434 and load-3 436 may be concurrently active. Similarly, when the Phase_1_3 input signal at input 404 is asserted, SCRs 408 and 412 will turn on, as will low side switch 416. This allows current to flow through load-1 432 and load-3 436. Lastly, when the Phase_1_2 input signal at input 406 is asserted, SCRs 410 and 412 will turn on, as will low side switch 414. This allows current to flow through load-1 432 and load-2 434.

It will be readily apparent to those skilled in the art, from the foregoing description of FIG. 4, that any number of segments may be selected to create a polyphase self-latching H-bridge in accordance with the invention. The example illustrated in FIG. 4 is shown having three loads for purposes of illustration, and the invention is clearly not limited thereto.

Figure 5:
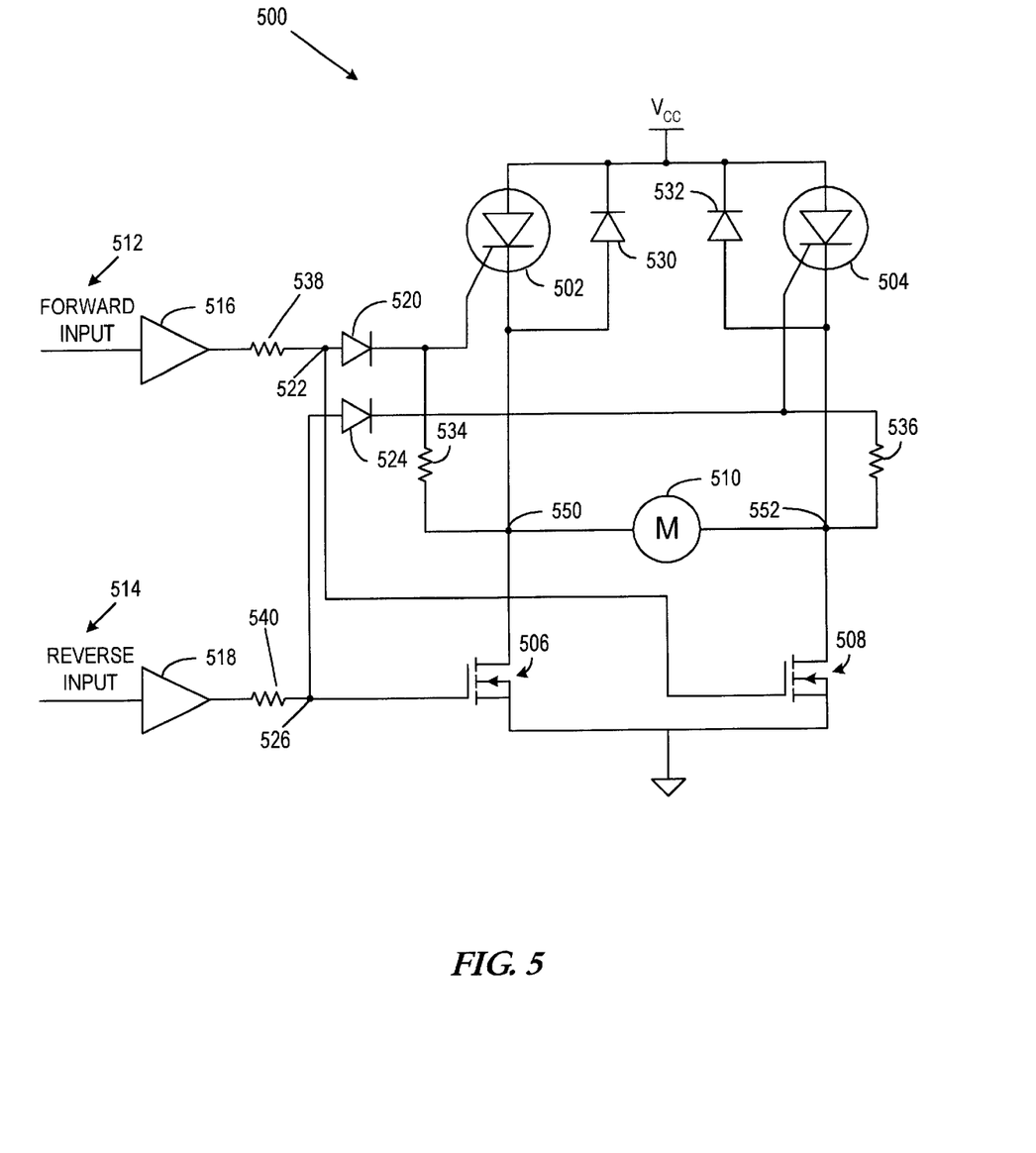
FIG. 5 illustrates an exemplary self-latching H-bridge in accordance with the invention, where a hybrid of bipolar and field-effect transistor technologies are employed.

FIG. 5 illustrates an exemplary self-latching H-bridge 500 in accordance with the invention, where a hybrid of bipolar and field-effect transistor (FET) technologies is employed. The embodiment of FIG. 5 includes additional features to enhance circuit operation and provide component protection.

The H-bridge 500 includes a pair of SCRs 502, 504 serving as the high-side, high power switches. At the low-side of the H-bridge 500 are two MOSFET transistors 506, 508. In this particular embodiment, a hybrid of bipolar and field-effect transistor (FET) technologies is employed. The SCRs 502 and 504 used on the high side are bipolar devices, but unlike conventional bipolar transistors that require supplying a continuous base current, the SCR requires only a short trigger pulse to latch (e.g., a few microseconds). As described above, the SCRs 502, 504 are turned on by utilizing a trigger signal to initiate current flow through the SCRs, but when the SCR is turned on, the cathode-to-gate voltage is reverse biased such that no additional trigger current flows into the gate. Therefore, this circuit exploits the benefits of bipolar technology, yet circumvents the need to provide a continual gate current with a resultant low power dissipation in the driver circuitry.

On the low side, the illustrated embodiment utilizes MOSFET transistors 506, 508. An appropriately sized MOSFET can handle the current demands, and also provides for low power dissipation in the driver circuitry due to the ability to provide a gate voltage to the device rather than a current. The H-bridge embodiment of FIG. 5 therefore exploits desirable characteristics of both bipolar and MOSFET technologies.

The load in this example is a motor 510. When the SCR 502 and MOSFET 508 are turned on, current passes from VCC, through SCR 502, through the motor 510 in a first direction, through MOSFET 508, and to ground. Alternatively, when the SCR 504 and MOSFET 506 are turned on, current passes from VCC, through SCR 504, through the motor 510 in a second direction, through MOSFET 506, and to ground. In this manner, current is directionally passed through the motor 510, depending on which SCRs and MOSFETs are on.

As was described in connection with FIG. 3, the inputs to the H-bridge 300 are the forward input signal 512 and the reverse input signal 514, which may be provided by a motor direction control circuit, and a hold-off circuit if desired. In the embodiment illustrated in FIG. 5, each input signal 512, 514 is coupled to the H-bridge 500 through buffers 516, 518 respectively. Resistors 538, 540 may be used at the outputs of buffers 516, 518 respectively. The basic operation of the circuit 500 is analogous to that described in connection with FIG. 3. An asserted forward input signal 512 ultimately turns on the SCR 502 and the MOSFET 508, allowing the motor 510 to operate in a first direction. Similarly, when the reverse input signal 514 is asserted, SCR 504 is ultimately turned on, as well as MOSFET 506, allowing the motor 510 to operate in a second direction. The flow of the triggering gate currents into the SCRs 502, 504 is automatically terminated shortly after the respective SCR 502, 504 is turned on, as previously described. Isolation protection is provided via diodes 520, 524.

FIG. 5 includes additional features, including protection against inductive effects due to switching the direction of the motor, and false SCR triggering protection due to potential leakage currents in the circuit. More particularly, the H-bridge circuit 500 utilizes a snubber network, which in the illustrated embodiment comprises a pair of snubber diodes 530, 532. Snubber diode 530 is coupled in parallel with SCR 502, between VCC and node 550. It is arranged such that its cathode is coupled to VCC. Analogously, snubber diode 532 is coupled in parallel with SCR 504, between VCC and node 552, having its cathode coupled to VCC.

A snubber network may be used to minimize voltage spikes due to back-EMF (electromotive or electromagnetic force), i.e., inductive "kick back," seen at the nodes 550, 552, which can destroy components coupled to these nodes. The snubber diodes 530, 532 limit the induced voltage generated from the inductive load (i.e., motor 510) when the H-bridge 500 is switched, thereby protecting components coupled to the respective nodes. The snubber diodes accomplish this by clamping the maximum voltage at the nodes 550, 552 to approximately two diode voltage drops more than VCC. At the low end of the H-bridge, snubber diodes may not be required where MOSFET switches are used, as these devices inherently include such a diode junction within the device itself. However, where other components such as bipolar devices (e.g., BJT, IGBT, etc.) are used on the low end, additional discrete snubber diodes may be used to provide this protection against inductive kick back.

H-bridge 500 also includes gate resistor 534 and gate resistor 536. These resistances are placed between the gate and cathode terminals of the SCR. For example, resistor 534 is coupled between the gate input of SCR 502 and the cathode of SCR 502 (i.e., node 550). Resistor 534 is used to minimize the chance that leakage current between the cathode and gate of the SCR 502 will actually turn on the SCR 502. In one embodiment of the invention, this resistor 534 is approximately 10 K-ohm.

Figure 6:
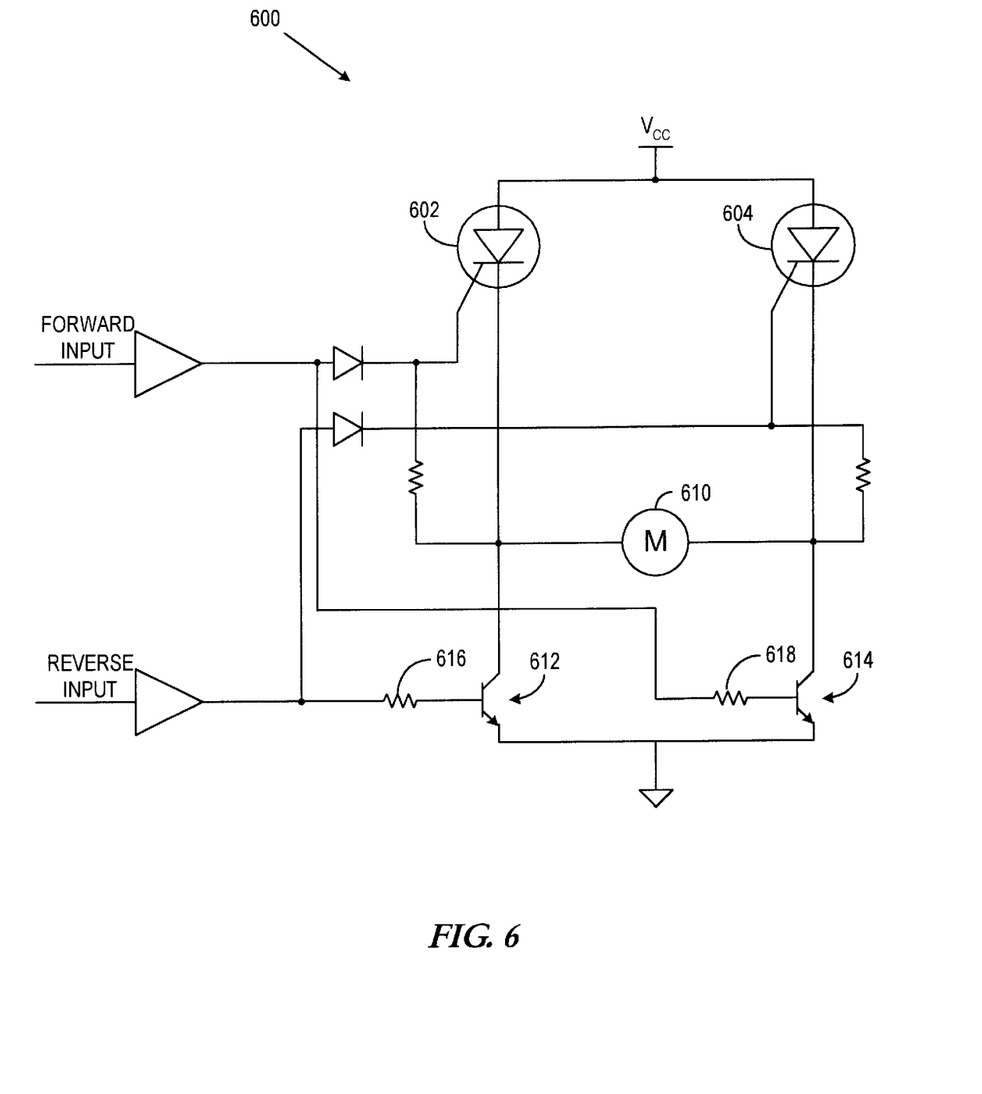
FIG. 6 illustrates an exemplary self-latching H-bridge in accordance with the invention, where bipolar transistors are used on the low side of the H-bridge.

FIG. 6 illustrates an exemplary self-latching H-bridge 600 in accordance with the invention, where bipolar transistors are used on the low side of the H-bridge 600. The H-bridge 600 is substantially the same as that described in connection with the H-bridge 500 of FIG. 5, except that bipolar transistors 612, 614 are used rather than MOSFET devices. Due to the nature of bipolar transistors 612, 614, they require a current provided to the base of each transistor. Resistor 616 is coupled to the base of bipolar transistor 612, and a base current is provided to turn on transistor 612 when SCR 604 is turned on, to operate the motor 610 in the reverse direction. Resistor 618 is coupled to the base of bipolar transistor 614, and a base current is provided to turn on transistor 614 when SCR 602 is turned on, to operate the motor 610 in the forward direction. This embodiment is provided to merely illustrate that various alternative options exist for providing the switching function on the low side of the H-bridge bridge circuits described herein. Further, an embodiment utilizing low side bipolar technology such as that illustrated in FIG. 6 may incorporate discrete snubber diodes (not shown), as this function is not inherent to bipolar devices as is the case with MOSFET switching devices.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. An H-bridge for controlling current through a load, wherein the H-bridge is coupled between a supply voltage and a reference voltage, the H-bridge comprising:

a forward circuit coupled between the supply and reference voltages, wherein the forward circuit comprises the load, a first low side switch coupled to receive a forward input signal, and a first high side thyristor coupled to receive the forward input signal at its control gate, and wherein assertion of the forward input signal turns on the first low side switch and the first high side thyristor to allow a current to flow in a first direction through the first high side thyristor, the load, and the first low side switch; and a reverse circuit coupled between the supply and reference voltages, wherein the reverse circuit comprises the load, a second low side switch coupled to receive a reverse input signal, and a second high side thyristor coupled to receive the reverse input signal at its control gate, and wherein assertion of the reverse input signal turns on the second low side switch and the second high side thyristor to allow a current to flow in a second direction through the second high side thyristor, the load, and the second low side, switch, wherein the amplitude of the asserted forward and reverse input signals is lower than the amplitude or the supply voltage.

2. The H-bridge as in claim 1, further comprising an isolation protection circuit coupled to the control gates of the first and second thyristors to isolate at least the first and second low side switches from a voltage imparted to the control gates of the first and second thyristors when the respective one of the first and second thyristors has been turned on.

3. The H-bridge as in claim 2, wherein the isolation protection circuit comprises a gate-to-cathode junction integral to the thyristors.

4. The H-bridge as in claim 3, wherein the supply voltage is less than a reverse breakdown voltage of the gate-to-cathode junction of the thyristors, such that the gate-to-cathode junction provides the isolation of the voltage imparted to the control gates of the first and second thyristors.

5. The H-bridge as in claim 2, wherein the isolation protection circuit comprises a pair of diodes, one coupled to each of the thyristors, such that the cathode of each diode is coupled to the control gate of each of the thyristors.

6. The H-bridge as in claim 5, wherein the supply voltage is greater than a reverse breakdown voltage of the gate-to-cathode junction of the thyristors, such that the diodes provide the isolation of the voltage imparted to the control gates of the first and second thyristors.

7. The H-bridge as in claim 1, further comprising a snubber circuit coupled between the supply voltage and the load to substantially limit a magnitude of voltage transients due to back-electromotive force (EMF) resulting from switching a direction of the current through the load.

8. The H-bridge as in claim 7, wherein the snubber circuit comprises a pair of diodes, one for each of the forward and reverse circuits, wherein each diode is arranged such that its cathode is coupled to the power supply, and its anode is coupled to a different lead of the load.

9. The H-bridge as in claim 1, further comprising a pair of gate resistors, one for each of the first and second thyristors, coupled between the control gate and a cathode of its respective one of the first and second thyristors to reduce leakage currents therebetween.

10. The H-bridge as in claim 1, wherein the low side switches are MOSFET transistors.

11. The H-bridge as in claim 1, wherein the low side switches are bipolar transistors.

12. The H-bridge as in claim 1, wherein each of the low side switches comprises one of a field-effect transistor, bipolar transistor, insulated gate bipolar transistor (IGBT), or relay.

13. The H-bridge as in claim 1, further comprising means, coupled to the control gates of the first and second thyristors, for generating a current pulse to trigger the current to flow through a respective one of the first or second thyristors.

14. The H-bridge as in claim 13, wherein the voltage at a cathode or each of the thyristors exceeds a specified voltage upon turn on of the respective one of the thyristors, causing its respective cathode-to-gate junction to become reverse biased and thereby terminating the current pulse.

15. The H-bridge as in claim 1, wherein the load is a reversible, direct current (DC) electric motor.

16. The H-bridge as in claim 1, wherein the first and second high side thyristors comprise silicon-controlled rectifiers.

17. A polyphase H-bridge for controlling currents through a plurality of loads, wherein the polyphase H-bridge is coupled between a supply voltage and a reference voltage, comprising:

n high side thyristors each having a cathode, an anode, and a control gate, wherein the anodes of each of the thyristors is coupled to the supply voltage;

n loads, each of the n loads coupled between the cathodes of two different ones of the n thyristors;

n low side switches each coupled between the cathode of one of the n thyristors and the reference voltage, wherein each of the n low side switches comprises a control input;

n H-bridge input terminals, each coupled to the control gate of the thyristors and the control input of the low side switches across the loads in which bi-directional current is desired to flow, whereby asserting a signal at a corresponding one of the n H-bridge input terminals enables the current to flow through the respective loads, wherein the amplitude of the asserted signal is lower than the amplitude of the supply voltage.

18. The polyphase H-bridge as in claim 17, further comprising a plurality of isolation circuits, each one of the isolation circuits coupled between the control gates of one of the n thyristors and one or more of the n low side switches, to isolate the one or more n low side switches from a voltage imparted to the control gates of the respective thyristors when turned on.

19. A system for controlling a motor, comprising:

a motor direction control circuit to output forward and reverse direction signals;

a hold-off circuit coupled to the motor direction control circuit to delay assertion of either the forward or reverse direction signals until the other of the forward or reverse direction signal has been disabled;

a direct current (DC) motor capable of operation in both forward and reverse directions; and an H-bridge coupled to the DC motor and to the hold-off circuit to receive the forward and reverse direction signals, wherein the H-bridge is further coupled to a supply voltage and a reference voltage, the H-bridge comprising:

a forward circuit coupled between the supply and reference voltages, wherein the forward circuit comprises the DC motor, a first low side switch coupled to receive the forward direction signal, and a first high side silicon-controlled rectifier (SCR) coupled to receive the forward direction signal at its control gate, and wherein assertion of the forward direction signal turns on the first low side switch and the first high side SCR to allow a current to flow through the first high side SCR, the DC motor, and the first low side switch; and a reverse circuit coupled between the supply and reference voltages, wherein the reverse circuit comprises the DC motor, a second low side switch coupled to receive a reverse direction signal, and a second high side SCR coupled to receive the reverse direction signal at its control gate, and wherein assertion of the reverse direction signal turns on the second low side switch and the second high side SCR to allow a current to flow through the second high side SCR, the DC motor, and the second low side switch.

20. A self-latching H-bridge, powered by a power source, for controlling bi-directional current through a load, comprising:

a first silicon-controlled rectifier (SCR) having an anode, a cathode, and a gate input; wherein the first SCR is coupled to the power source via the anode;

a first switch coupled between a reference voltage and the cathode of the first SCR through the load, wherein the first switch comprises a first control input;

a first buffer coupled to the first SCR gate input and the first control input to turn on the first SCR and the first switch upon output of a forward direction signal to conduct current in a first direction;

a second SCR having an anode, a cathode, and a gate input; wherein the second SCR is coupled to the power source via the anode;

a second switch coupled between the reference voltage and the cathode of the second SCR through the load, wherein the second switch comprises a second control input; and a second buffer coupled to the second SCR gate input and the second control input to turn on the second SCR and the second switch upon output of a reverse direction signal to conduct current in a second direction, wherein the amplitude of the forward and reverse direction signals is lower than the amplitude of the power source.

21. The self-latching H-bridge as in claim 20, wherein the first and second buffers are powered by a second power source providing a digital DC voltage less than a DC voltage provided by the power source.

22. The self-latching H-bridge as in claim 20, further comprising a diode having an anode coupled to the first buffer and a cathode coupled to the gate input of the first SCR, wherein the diode isolates at least the first switch from a voltage imparted to the gate input of the first SCR when the first SCR is turned on.

23. The self-latching H-bridge as in claim 20, further comprising a diode having an anode coupled to the second buffer and a cathode coupled to the gate input of the second SCR, wherein the diode isolates at least the second switch from a voltage imparted to the gate input of the second SCR when the second SCR is turned on.

24. The self-latching H-bridge as in claim 20, further comprising a snubber diode to limit back-EMF generated by the load upon switching, wherein the snubber diode comprises a cathode coupled to the power source and an anode coupled to a first load terminal.

25. The self-latching H-bridge as in claim 24, further comprising a second snubber diode to limit back-EMF generated by the load upon switching, wherein the second snubber diode comprises a cathode coupled to the power source and an anode coupled to a second load terminal.

26. The self-latching H-bridge as in claim 20, wherein the first and second switches are MOSFET transistors, and wherein the first and second control inputs are first and second MOSFET gates respectively.

27. The self-latching H-bridge as in claim 20, wherein the first and second switches are bipolar transistors, and wherein the first and second control inputs are first and second bipolar base terminals respectively.

28. A self-latching H-bridge for controlling the power supply current through a load, comprising:

high side switching means for controllably driving current through the load in multiple directions, wherein the high side switching means comprise a plurality of controlled rectifiers;

low side switching means for controllably enabling forward and reverse current paths through the load from the high side switching means;

means for triggering the plurality of controlled rectifiers and the low side switching means for identifying which of the forward and reverse current paths the current through the load will be directed, wherein the means for triggering utilizes triggering signal amplitudes lower than the amplitude of the power supply.

29. The self-latching H-bridge as in claim 28, further comprising means for limiting a voltage at each terminal of the load resulting from inductive kick-back or the load in response to switching between the forward and reverse current paths.

30. The self-latching H-bridge as in claim 28, further comprising means for reducing leakage current between a cathode terminal and a gate terminal of each of the plurality of controlled rectifiers.

31. The self-latching H-bridge as in claim 28, further comprising means for specifying a desired motor direction.

32. The self-latching H-bridge as in claim 31, further comprising delay means, coupled to the means for specifying a desired motor direction, for delaying a forward direction signal until a reverse direction signal is deactivated when the current is to be directed to the forward current path, and for delaying the reverse direction signal until the forward direction signal is deactivated when the current is to be directed to the reverse current path.

33. The self-latching H-bridge as in claim 28, further comprising means for automatically discontinuing a triggering gate current provided by the triggering means upon the controlled rectifier conducting current, thereby terminating the flow of gate current as soon as it is no longer required.

34. The self-latching H-bridge as in claim 28, further comprising means for discontinuing the forward current path via the low side switching means.

35. The self-latching H-bridge as in claim 28, further comprising means for discontinuing the reverse current path via the low side switching means.

* * * * *

UNITED STATES PATENT AND TRADEMARK OFFICE
CERTIFICATE OF CORRECTION

PATENT NO.     : 6,617,913 B1
DATED          : September 9, 2003
INVENTOR(S)    : Johnson It is certified that error appears in the above-identified patent and that said Letters Patent is hereby corrected as shown below:

Column 11,
Line 38, "the amplitude or the supply" should read -- the amplitude of the supply --.

Column 12,
Line 24, "cathode or each" should read -- cathode of each --.

Signed and Sealed this

Twenty-eighth Day of October, 2003

JAMES E. ROGAN
*Director of the United States Patent and Trademark Office*